(12) United States Patent
Weems

(10) Patent No.: US 6,844,736 B2
(45) Date of Patent: Jan. 18, 2005

(54) SYSTEMS AND METHODS FOR LOCATING A GROUND FAULT WITHOUT DE-ENERGIZING THE CIRCUIT

(75) Inventor: Warren Weems, Chandler, AZ (US)

(73) Assignee: WMW Group LLC, Avondale, AZ (US)

( * ) Notice: Subject to any disclaimer, the term of this patent is extended or adjusted under 35 U.S.C. 154(b) by 0 days.

(21) Appl. No.: 10/215,310

(22) Filed: Aug. 8, 2002

(65) Prior Publication Data

US 2004/0027134 A1 Feb. 12, 2004

(51) Int. Cl.$^7$ .............................................. G01R 31/14
(52) U.S. Cl. ........................ 324/509; 324/510; 361/42; 361/62
(58) Field of Search .................................. 324/500, 508, 324/509, 510, 512, 521, 522, 525, 528, 531, 536, 537; 361/42, 62, 64, 67; 340/650, 651

(56) References Cited

U.S. PATENT DOCUMENTS 5,239,441 A * 8/1993 Fox et al. .................... 361/104
5,574,611 A * 11/1996 Nishijima et al. ............ 361/64

* cited by examiner

Primary Examiner—N. Le
Assistant Examiner—Vincent Q. Nguyen
(74) Attorney, Agent, or Firm—Michael F. Krieger; Kirton & McConkie

(57) ABSTRACT

Systems and methods for locating any grounded circuit on an ungrounded AC or DC system without de-energizing the circuit, and enabling isolation of the grounded component of the circuit. A load is fed through an isolation device, such as a transformer for AC systems or a DC-to-DC converter for DC systems, and isolated from the normal distribution system without ever being de-energized. Once the isolating device is paralleled with the normal source for the load, the normal source is removed, leaving the load energized and fed by the isolating device. A ground detector relay is added at the secondary side of the isolation device to detect unwanted grounds along with a ground locating method to isolate the source of the ground, such as by oscillating the ground current. Once the grounded circuit is located, further troubleshooting may be performed to isolate the grounded component.

19 Claims, 15 Drawing Sheets

SYSTEMS AND METHODS FOR LOCATING A GROUND FAULT WITHOUT DE-ENERGIZING THE CIRCUIT

BACKGROUND OF THE INVENTION

1. Field of the Invention

The present invention relates to systems and methods for locating a ground fault. More particularly, the present invention relates to systems and methods for locating any grounded circuit on an ungrounded AC or DC system without de-energizing the circuit, and enabling isolation of the grounded component of the circuit.

2. Background and Related Art

An electric circuit provides a path for electric current to travel that is typically composed of conductors, conducting devices, and a source of electromotive force that drives the current around the circuit. Current flows in an electric circuit in accordance with several definite laws, including Ohm's law, which provides that the amount of current flowing in a circuit made up of pure resistances is directly proportional to the electromotive force impressed on the circuit and inversely proportional to the total resistance of the circuit. Ohm's law applies to circuits for both direct current ("DC") and alternating current ("AC"), but additional principles must be invoked for the analysis of complex circuits and for AC circuits also involving inductances and capacitances.

An electric circuit may include an electrical connection to an electrical ground. An electrical ground is an electrically conductive body, such as the earth, which maintains a zero potential (i.e., it is not positively nor negatively charged). An electrical connection to a ground carries current away from the circuit.

Techniques currently exist that enable the detection of a ground. For example, ground detectors are available that sense that a ground exists somewhere on a vast ungrounded electrical system. Such fixed ground-detecting equipment typically detects and signals the presence of a ground on a large distribution system. Thus, once the ground is detected, an alarm will sound at the larger or higher-level distribution switchgear. While such a technique will alert a user that a ground is somewhere on the system, it cannot identify on which branch circuit the ground is located. Moreover, the technique is unable to locate the actual source of the ground.

Techniques are also available to perform ground location, which is the act of finding the source of the ground. However, the portable ground locating techniques used on uninterruptible systems supplying vital loads attempt to locate the grounded circuit by varying the ground current and looking for the oscillating current on each branch circuit using a current transformer. Accordingly, traditional ground locating equipment falls short in detecting high resistance grounds due to excessive noise on the system.

Thus, while techniques currently exist that are used to perform ground location, challenges still exist, such as poor signal to noise ratio with convention equipment. Accordingly, it would be an improvement in the art to augment or even replace current techniques with other techniques.

SUMMARY OF THE INVENTION

The present invention relates to systems and methods for locating a ground fault. More particularly, the present invention relates to systems and methods for locating any grounded circuit on an ungrounded AC or DC system without de-energizing the circuit, and enabling isolation of the grounded component of the circuit.

Implementation of the present invention enables a load to be fed through an isolation device, such as a transformer for AC systems or a DC-to-DC converter for DC systems, and isolated from the normal distribution system without ever being de-energized. Once the isolating device is paralleled with the normal source for the load, the normal source is removed, leaving the load energized and fed through the isolating device solely. Accordingly, any ground that comes in on the secondary side of the isolation device is isolated from the system feeding it. A ground detector relay is added at the secondary side of the isolation device to detect unwanted grounds along with a ground locating method to isolate the source of the ground, such as by oscillating the ground current.

Furthermore, implementation of the present invention recognizes that grounds generally come in on lower amperage circuits, and that these circuits are generally not on the main switchgear but instead are located in a smaller distribution switchgear that is fed from the larger switchgear.

Accordingly, the systems and methods of the present invention locate any grounded circuit on an ungrounded AC or DC system without de-energizing the circuit. Once the grounded circuit is located, further troubleshooting can be performed to isolate the grounded component. These and other features and advantages of the present invention will be set forth or will become more fully apparent in the description that follows and in the appended claims. The features and advantages may be realized and obtained by means of the instruments and combinations particularly pointed out in the appended claims. Furthermore, the features and advantages of the invention may be learned by the practice of the invention or will be obvious from the description, as set forth hereinafter.

BRIEF DESCRIPTION OF THE DRAWINGS

In order that the manner in which the above recited and other features and advantages of the present invention are obtained, a more particular description of the invention will be rendered by reference to specific embodiments thereof, which are illustrated in the appended drawings. Understanding that the drawings depict only typical embodiments of the present invention and are not, therefore, to be considered as limiting the scope of the invention, the present invention will be described and explained with additional specificity and detail through the use of the accompanying drawings in which.

DETAILED DESCRIPTION OF THE INVENTION

Figure 1:
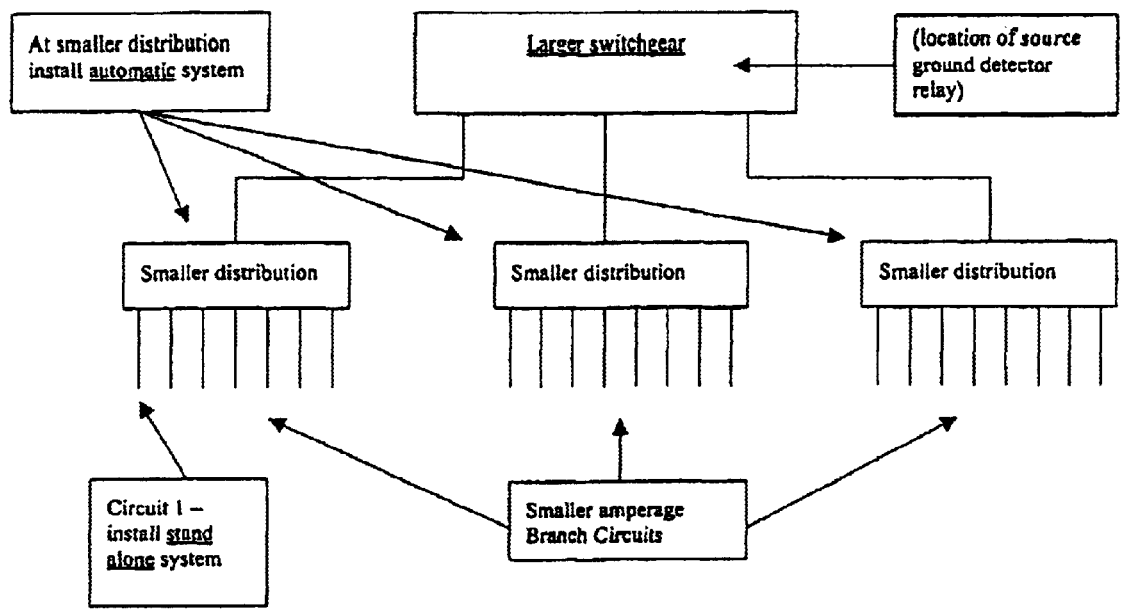
FIG. 1 illustrates a representative circuit in which a ground may be detected in accordance with the present invention.

The present invention relates to systems and methods for locating a ground fault. More particularly, the present invention relates to systems and methods for locating any grounded circuit on an ungrounded AC or DC system without de-energizing the circuit, and enabling isolation of the grounded component of the circuit.

Some embodiments of the present invention enable a load to be fed through an isolation device, such as a transformer or distribution switchgear for AC systems or a DC-to-DC converter for DC systems, and isolated from the normal distribution system without ever being de-energized. Once the isolating device is paralleled with the normal source for the load, the normal source is removed, leaving the load energized and fed through the isolating device solely. Thus, any ground that comes in on the secondary side of the isolation device is isolated from the system feeding it.

Some embodiments further embrace adding a ground detector relay at the secondary side of the isolation device to detect unwanted grounds and using a ground locating method to isolate the source of the ground, such as by oscillating the ground current.

Some embodiments of the present invention also recognize that grounds come in on lower amperage circuits. Such circuits are generally not on the main switchgear, but instead are located on a smaller distribution switchgear that is fed from the larger switchgear. While in some embodiments, the grounds come in on circuits rated at 30 amps or less, those skilled in the art will appreciate that other embodiments embrace circuits rated higher than 30 amps.

Accordingly, as will be further discussed below, embodiments of the present invention locate any grounded circuit on an ungrounded AC or DC system without de-energizing the circuit. Once the grounded circuit is located, further troubleshooting may be performed to isolate the grounded component.

The following discussion relates to three representative methods for seeking ground in accordance with the present invention. The methods are based on the concept of using an isolation device (to electrically isolate output from input), a ground detector relay on the output, a ground location signal, and a way to detect the signal. Those skilled in the art will appreciate that the following are three methods provided for representative illustration only.

A first method in accordance with the present invention embraces a fixed "stand alone" ground seeking (SAGS) system. If a branch circuit is known to constantly be the source of unwanted ground alarms at the source ground detecting relay, it can be isolated by installing this SAGS system permanently near the source of the ground. If a a fault to ground occurs, the SAGS system will only actuate the ground detector at the isolation device and not the system ground detection relay. In addition, the ground current may be oscillated at a frequency of less than 60 hertz. The resulting oscillating ground current can then be traced on the field cable that is supplying the fault current with a hand held signal detector specifically targeting the oscillated frequency so that the location where the fault occurred can be determined. The SAGS system is one that does not rely on multiple components placed at various locations in several switchgears, it in fact "stands by itself" on the circuit for which it is monitoring. It is self sufficient in its design and can be permanently installed to monitor ungrounded circuits for possible prolonged faults.

For example, and with reference now to FIG. 1, Circuit 1 feeds a component in a moist environment that constantly has a high resistance path to ground and triggers the source ground detector relay on the larger switchgear. However, Circuit 1 cannot be turned off because the load is vital to the operation of an industrial plant. Thus, by installing the fixed or stand-alone unit near the load(s), the troublesome ground alarm will not actuate the source ground-detecting relay. Instead it will actuate the stand-alone system relay. Once the relay has actuated, a technician may search for the source of the ground using a ground location signal option.

A second method in accordance with the present invention embraces an automatic ground seeking (AGS) system. With reference to FIG. 1, an automatic version may be installed at the smaller distribution system where the isolation device and ground detection relay may be paralleled onto each circuit, one at a time. The normal feed is momentarily de-energized, leaving the circuit to be fed alone through the isolation device. If a ground fault occurs in the circuit, the automatic ground seeker relay actuates and identifies the circuit that contains the fault to ground. If the circuit does not have a ground, the normal feed is re-energized (in parallel with the AGS system) and the AGS system rapidly moves to the next circuit to perform a search. This pattern continues until the grounded circuit has been identified.

Once located, a ground location signal is switched on until the source of the ground is located. The advantage with this AGS system is that it immediately locates the circuit that has a ground without any human intervention. Moreover, the location is performed continuously, 24 hours a day, seven days a week. Furthermore, the AGS system is able to capture intermittent or cycling grounds as well as multiple grounds.

A third method in accordance with the present invention embraces a portable ground seeking (PGS) system. A common misunderstanding is that breakers cannot be opened to search for grounds, otherwise the vital load will de-energize. However, an isolating device having a ground detector and ground locating signal may be paralleled onto a suspected grounded circuit and the normal breaker shut off to provide the (PGS) system as the only feed to the suspected grounded circuit.

If a ground fault occurs in the circuit, the ground detector relay of the PGS actuates to inform the user/technician that a ground fault has been detected. The ground location signal may then be applied so that the source of the ground is located. The PGS system enables grounds to be found with little or no modifications to plant equipment and thus minimal cost to the consumer.

While the following illustrative discussion relates to the PGS system, those skilled in the art will appreciate the methods, processes and features discussed herein relating to the PGS system also apply to other systems and embodiments of the present invention.

Embodiments of the present invention that enable ground seeking for AC ground detection and location can be comprised of two methods using different isolation devices, an AC voltage transformer or a DC voltage to AC voltage converter: (i) An AC voltage transformer, a ground detector relay, a circuit to oscillate the ground current and a signal detector. (ii) A DC voltage to ac voltage inverter, a ground detection relay, a circuit to oscillate the ground current and a signal detector. In both cases the output of the isolation device is an AC voltage. The ground detection relay is connected to the output of the isolation device to allow detection of ground fault current. Once detected, the ground fault current is oscillated at a specific frequency so that the location where the fault has occurred can be determined using a signal detector designed to accept the specific frequency and reject all other frequencies.

Alternatively, embodiments of the present invention that enable ground fault seeking for DC ground detection and location can be comprised of two methods using different isolation devices, a DC voltage to DC voltage converter or an AC voltage to DC voltage converter: (i) A DC voltage to DC voltage converter, a ground detection relay, a circuit to oscillate the ground current and a signal detector. (ii) An AC voltage to DC voltage converter, a ground detection relay, a circuit to oscillate the ground current and a signal detector. In both cases the output of the isolation device is a DC voltage. The ground detection relay can then be connected to the output of the isolation device to allow detection of ground fault current. Once detected, the ground fault current is oscillated at a specific frequency so that the location where the fault has occurred can be determined using a signal detector designed to accept the specific frequency and reject all other frequencies.

In accordance with embodiments to the present invention a PGS system incorporates two troubleshooting techniques to systematically isolate the grounded component, namely voltage isolation from the normal system voltage and ground current oscillation. Once the system alarm relay activates, a first step (phase one) of a troubleshooting method is to isolate the grounded circuit using "voltage isolation."

The following relates to phase one troubleshooting: The closer the ground is to the system relay the less the noise. However, since the ground cannot be moved closer to the relay, the PGS system takes the relay closer to the ground. By isolating the circuit that has experienced a fault to ground from the system, theoretically a large amount of noise has been eliminated.

Figure 2:
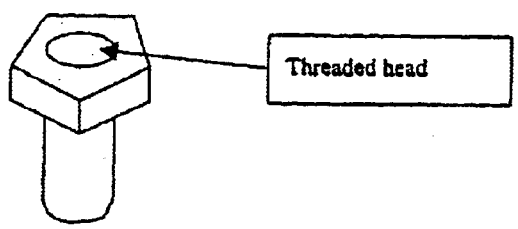
FIG. 2 illustrates a representative mechanism for paralleling a system onto a suspect breaker.
Figure 3:
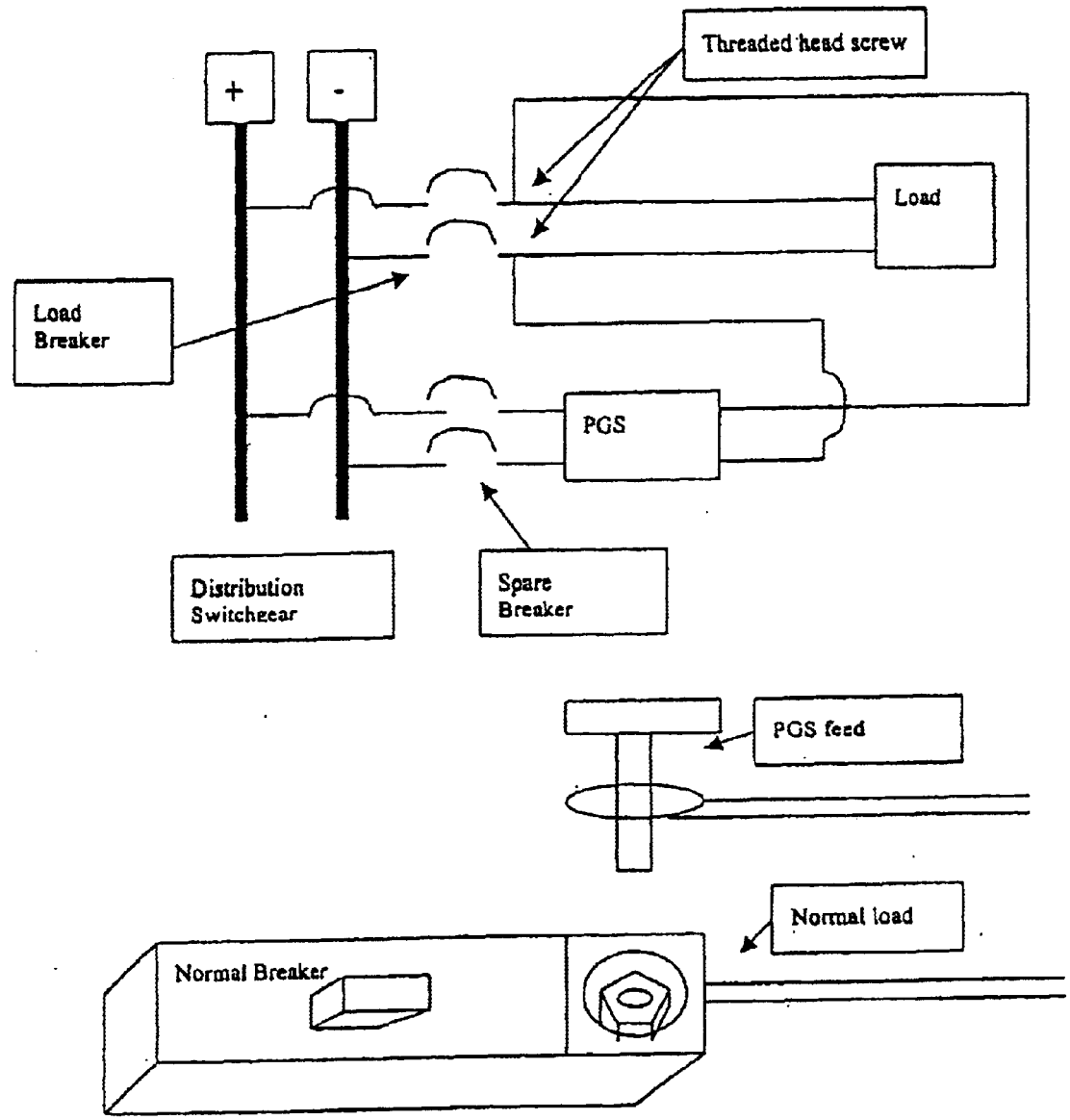
FIG. 3 illustrates a representative technique for paralleling a system onto a suspect breaker for a DC system.

To take advantage of the voltage isolation technique, two representative methods of connection are offered. In a first method, a spare is installed at each smaller distribution switchgear to supply power to the PGS system. The PGS system will then match the system voltage at its output. Also, the machine screws that attach the field wires of each circuit are replaced with a threaded head machine screw, as illustrated in FIG. 2. Accordingly, the PGS system may be paralleled onto the suspect breaker. With reference to FIG. 3, a representative technique is illustrated for a DC system, but similarly works for AC systems.

Once the voltage has been matched to the suspect breaker, the normal (suspect) breaker is turned off and the PGS system feeds the load. The ground detector apparatus will operate if there is a ground on the circuit, the appropriate light is illuminated on the PGS system. If the circuit has been discovered to have a fault to ground, the user can implement the techniques discussed in phase two of the troubleshooting. After the suspect circuit has been checked and no ground has been detected, the normal breaker is turned on, the PGS leads are removed, and then a focus is made on the next breaker in question.

A slight risk exists with this method that the normal breaker may fail to re-close, leaving the PGS system as the new feed to the load until it could be de-energized and the breaker replaced. Therefore, the following method offers a way to check individual circuits without manipulating the breaker.

In a second method of the phase one troubleshooting, test switches may be installed to accommodate paralleling the test equipment into each branch circuit. The test switches are a combination of CT shorting switches and "make before break" test switches, also referred to as metering device test switches. The test switches are common in the utility industry.

There are many additional benefits for industries to install the test switches making this technique the preferred method. Not only do the switches provide connection for ground isolation equipment but serve as access points to each circuit facilitating such things as "easy" chart recorder connections, amp, volt, resistance, and watt or watt-hour measurements, temporary power, etc.

Figure 4:
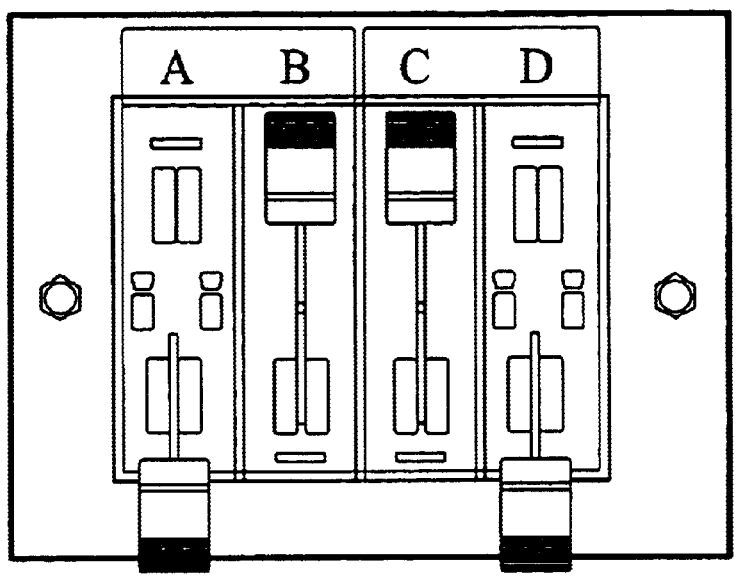
FIG. 4 illustrates representative test switches.
Figure 5:
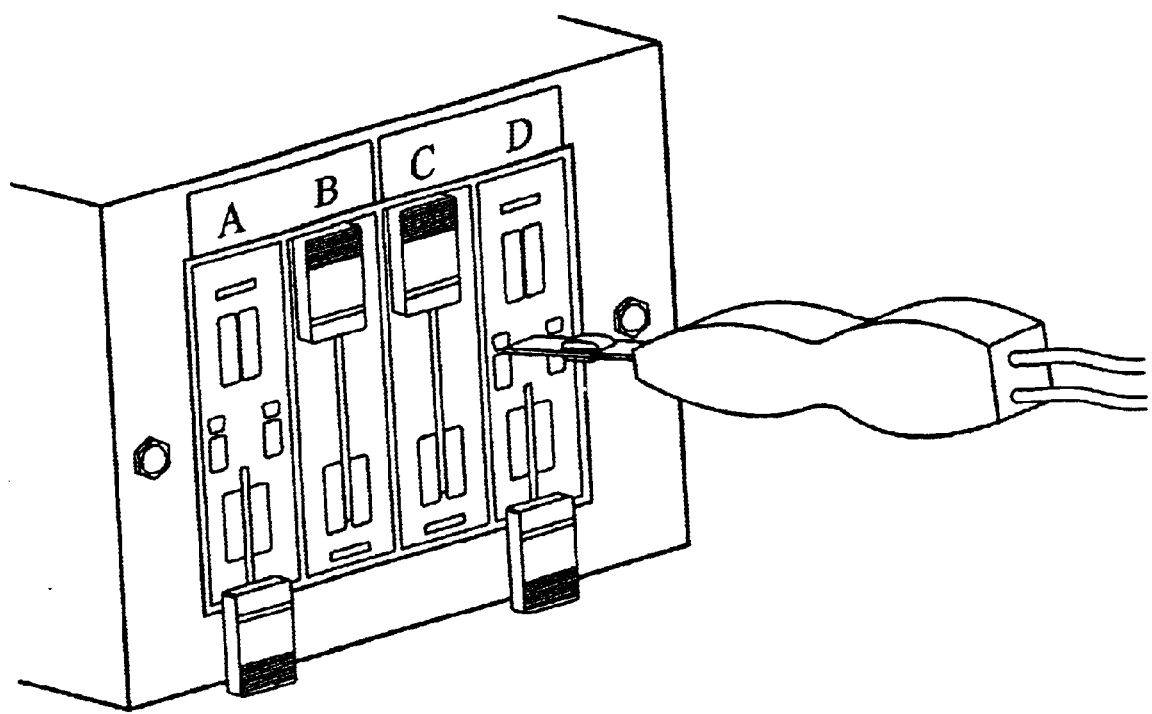
FIG. 5 illustrates a representative test probe.

The combination of test switches illustrated in FIG. 4 allows test probes to be inserted therein and provides the source with a path to the input of the PGS system equipment without disconnecting the power to the load. The PGS system then matches the source or system voltage and a "sources matched" light is illuminated on the test equipment. Once the sources are matched, the ganged switch (located in the center) is opened. This switch is a "make before break" switch, which allows the PGS to be paralleled before disconnecting the system power source. The probe illustrated in FIG. 5 is a test probe.

Figure 6:
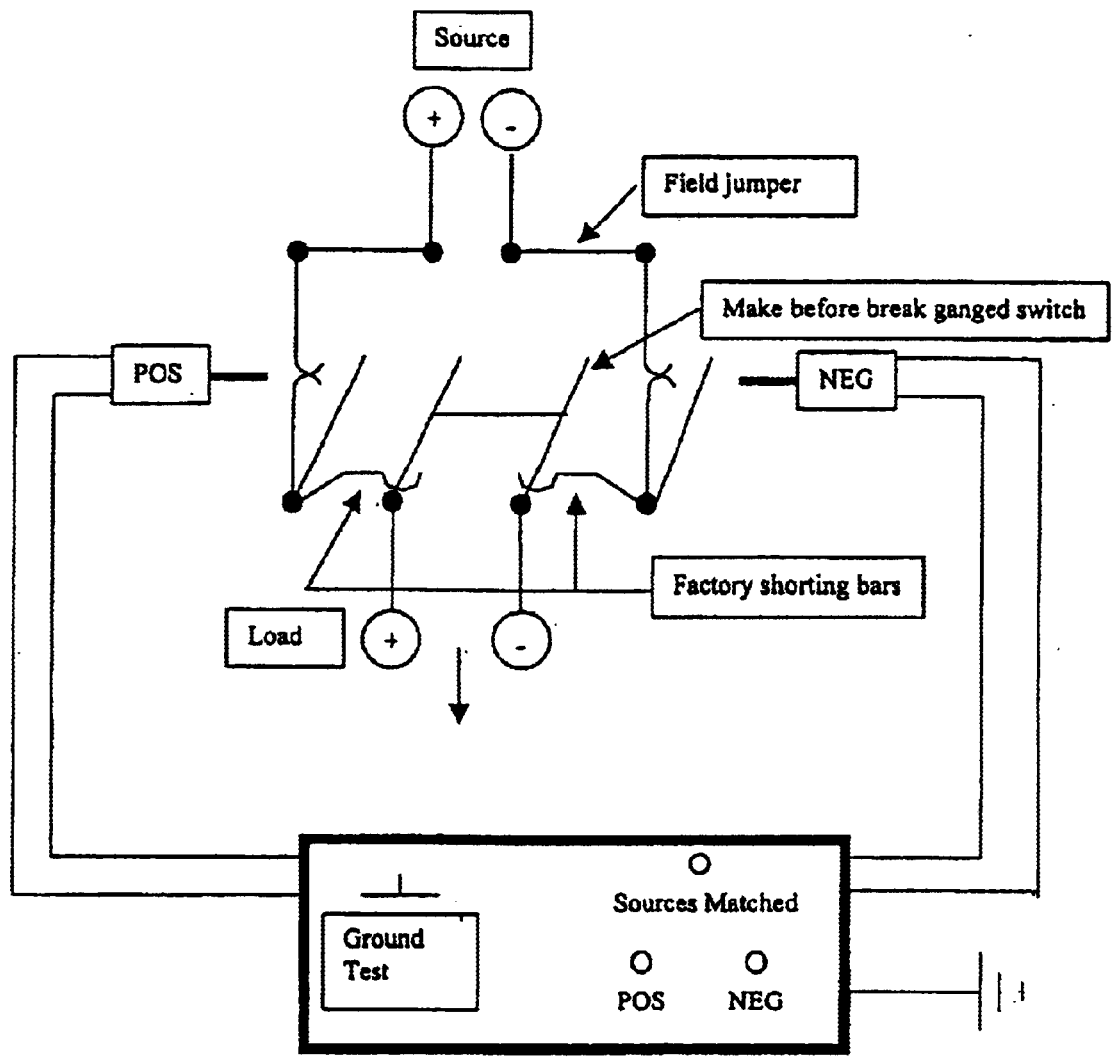
FIG. 6 illustrates a representative method for paralleling a system in accordance with the present invention.

With reference now to FIG. 6, an illustration is provided that depicts a representative method for paralleling a PGS system. The normal position of the switches is a closed position, which allows power to be uninterruptedly fed to the load. If the circuit is suspected to have a fault to ground, then the two outside switches are first opened to allow the probes of the PGS to be inserted, powering up the PGS system. The PGS system may either match its output voltage to the input voltage automatically or manually by the technician. A "sources matched" indication will illuminate. Next, the inner-ganged switches are opened. As the inner switches are opened, they connect with the factory shorting bars before they disconnect from the source. At this moment, the PGS system and the normal source are both feeding the load and are in parallel. As the switches continue their travel to the open position, they disconnect from the normal source. Power now is supplied by the PGS isolated system and has not de-energized the load.

Figure 7:
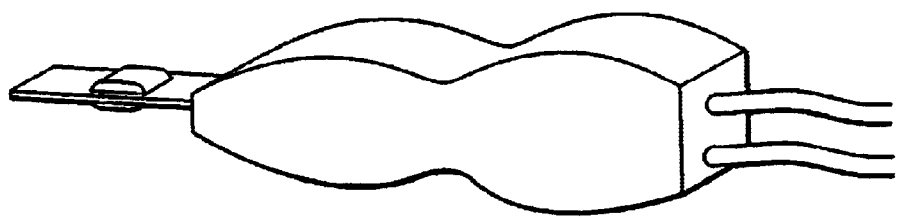
FIG. 7 illustrates a representative probe having an insulator that separates the top and bottom contacts of the probe.

With reference now to FIG. 7, an insulator separates the top and bottom contacts of the probes so that the two conductors never touch. Therefore, the two probes may be inserted, one at a time, into the respective positive or negative outside test switch without affecting power to the load.

The next step is to insert the ground detection apparatus on the PGS system and if there is a fault to ground on the circuit, the ground fault indicating light, will illuminate. If the indication is not illuminated, the technician re-closes the "make before break" ganged switch. As the switch travels, the system will again parallel with the PGS system briefly then the PGS system will be disconnected, leaving the load fed from the normal system voltage.

Once the PGS system is the sole feed to the grounded circuit, the voltages at the system relay return to a balanced state and the system relay resets. However, the technician will not know this since he is not at the system relay. Therefore, he must rely on the POS/NEG indication on the PGS system.

The following relates to phase two troubleshooting: At this point a decision should be made based on the following three options in order of risk:

1(a) If troubleshooting is to continue, what, if any, loads on the circuit can be de-energized in support of the planned troubleshooting?
  (b) If troubleshooting is not to continue, wait until the next planned equipment outage and de-energize the source. Then connect the PGS and search independently from the circuit's normal feed.
2. Switch to the ground current oscillation method of ground locating.
3. Continue with the voltage isolation method of ground locating.

Figure 8:
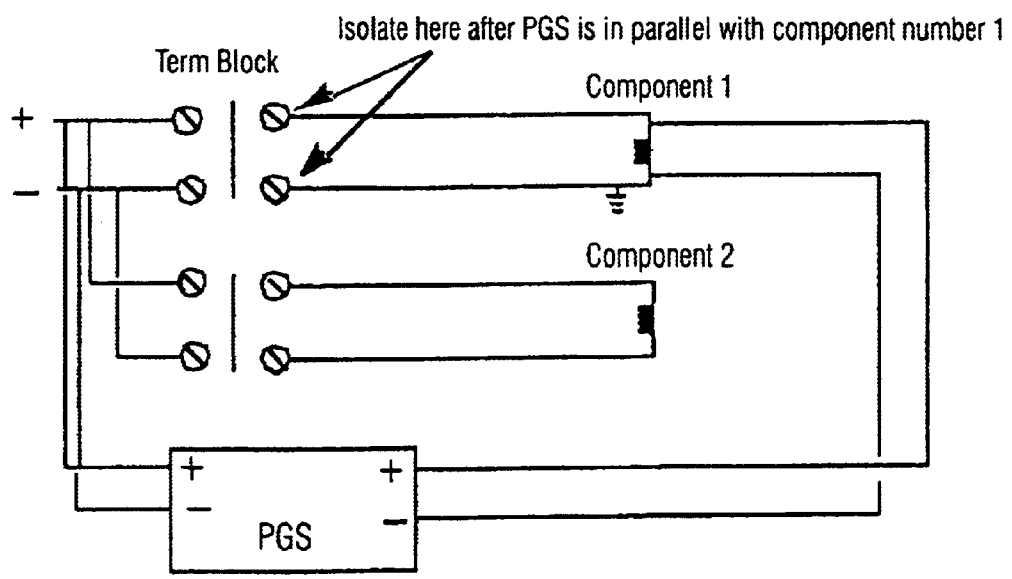
FIG. 8 illustrates a representative method for attaching the test leads of a system of the present invention to the wires feeding the individual component at a junction point.

The Voltage Isolation Method, which was previously used to locate a fault to ground, can now be used to locate the fault to ground at the component. With reference to FIG. 8, the test leads of the PGS system are attached to the wires feeding the individual component at some junction point, such as a terminal block. Once the PGS system is paralleled with the normal power source, the component is isolated from its normal source at the convenient location and the ground detector is activated on the PGS system to check the circuit for any ground. It is recognized that with any type of electrical troubleshooting, there is always a slight risk that human error may result in the circuit under test being inadvertently shorted or de-energized.

As grounded equipment is located over time, it may become apparent that the same circuits are repeatedly the source of the problems and the customer may consider permanently installing test switches at these points to minimize risks, facilitate and expedite the location of grounded equipment in the future. A further embodiment embraces the PGS system having proprietary test probes and switches.

Figure 9A:
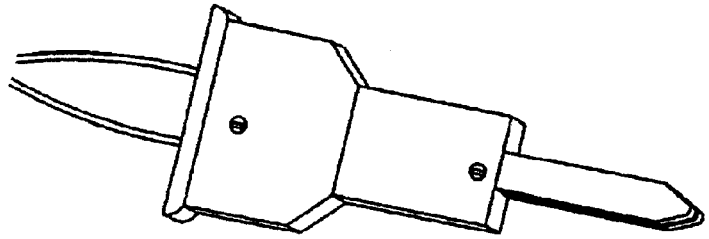
FIGS. 9A–9B illustrate a dual probe.
Figure 9B:
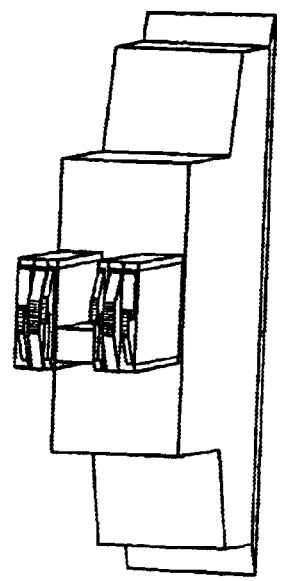
Figure 10A:
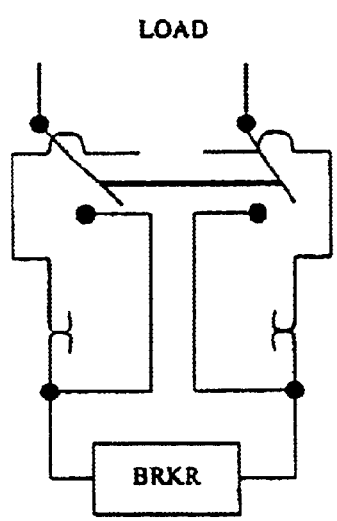
FIGS. 10A–10B illustrate a representative switch assembly.
Figure 10B:
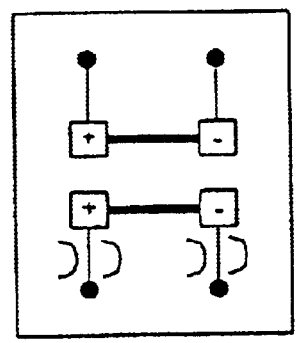

FIGS. 9A and 9B are representative of a Model XCA11A1 dual probe, which is incompatible with the commercially available test switches. The probe is designed for insertion into the test case of an IFC relay to facilitate testing and calibration of the relay. The illustrated probe may be used in association with a PGS system if a compatible test switch assembly is also included, such as is illustrated in FIGS. 10A and 10B. In addition, an embodiment of the present invention embraces offering a test probe and switch configuration where a user simply has to open the two "probe insertion points" (which could be ganged together), insert the dual probe, match the voltages and then open the upper ganged switch (to isolate the normal source). This provides a compact and convenient method for connecting the PGS system, and minimizes the possibility of an event due to human error.

The following relates to a current oscillation method of detecting a ground, and may be used in association with DC circuits. AC currents work in a similar way, but values may be different.

Grounds are divided into two ground classes, namely "hard" (low resistance to ground) and "soft" (high resistance to ground). For a soft ground that has high resistance (as shown in FIG. 11), the voltages will be slightly out of balance across the resistors and ground current will be at a minimum.

Figure 11:
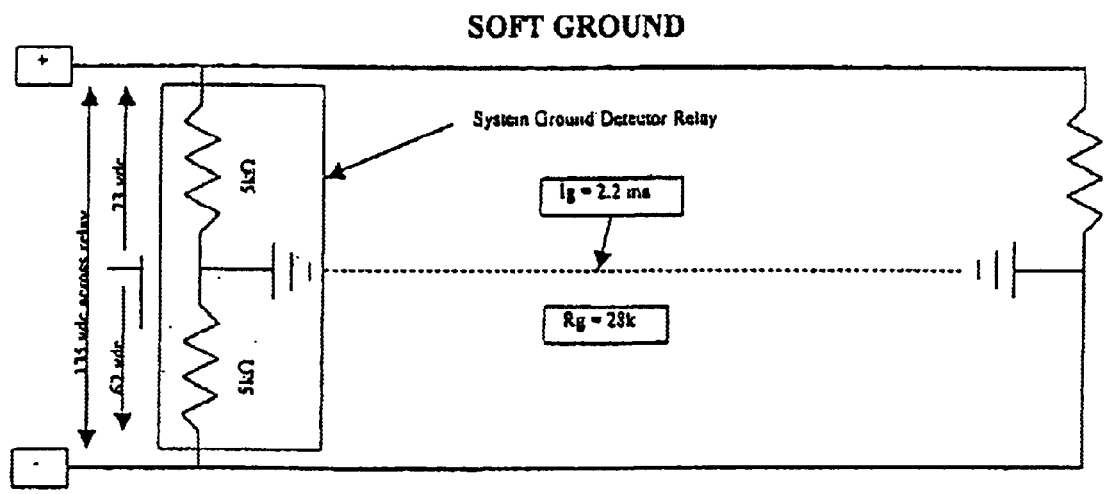
FIG. 11 illustrates a representative system ground detector relay in association with a soft ground.

FIG. 11 illustrates a representative 135VDC+ to − system. The ground current during a soft ground that overcomes the threshold of the system ground relay is 2.2 ma. Because the ground current is so low, noise on the system makes it very hard to detect the ground.

Figure 12:
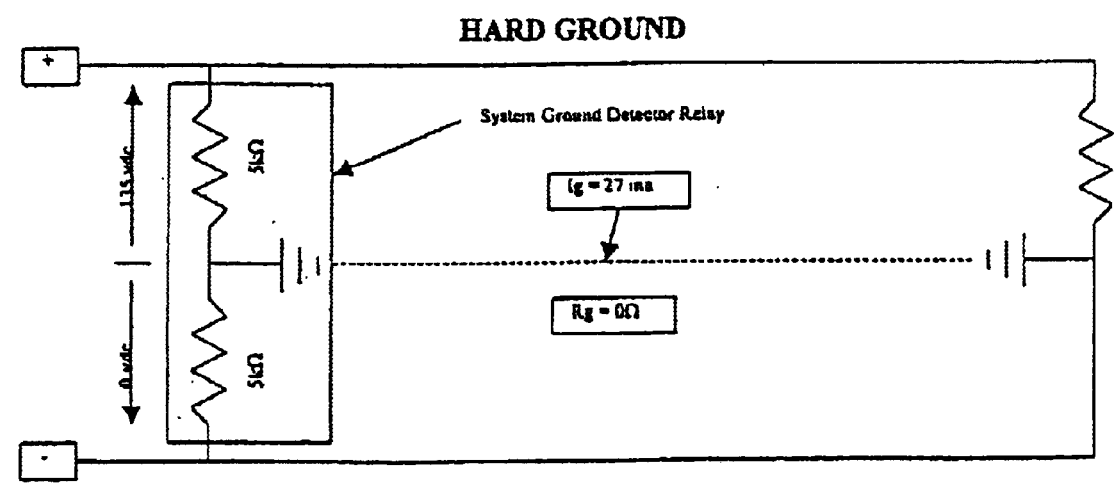
FIG. 12 illustrates a representative system ground detector relay in association with a hard ground.

For a ground that has no resistance, such as is illustrated in FIG. 12, all 135VDC is across one resistor of the system relay while the other resistor sees zero volts and the ground current is the greatest. When a hard ground occurs, the zero resistance to ground actually shorts across the 5 k resistor at the system relay. Now, the ground current is 12 times higher for hard grounds than for soft grounds and overcomes the amplitude of the noise on the system.

Figure 13:
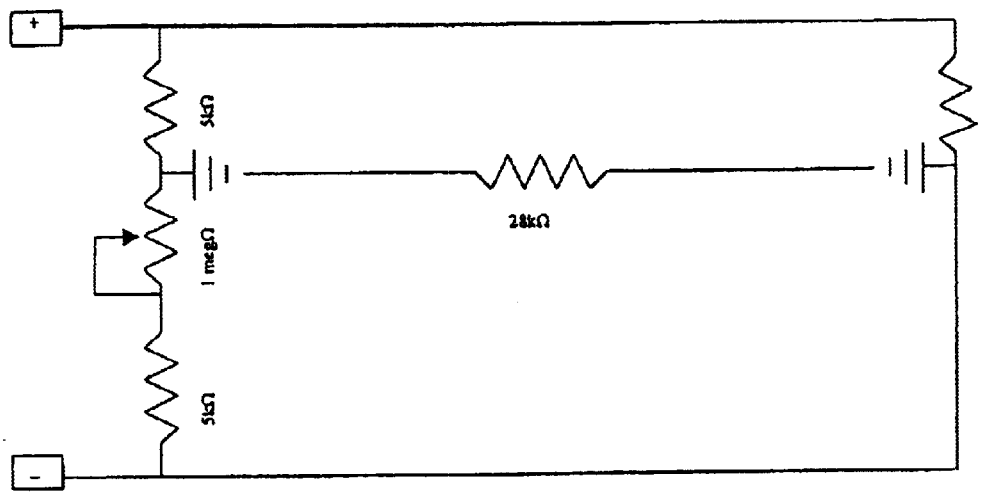
FIG. 13 illustrates an embodiment having a 1-megohm resistor in series with a 5 k resistor.

As provided above, the closer the ground is to the system relay, the less the noise. Similarly, the closer the relay (PGS system) is to the ground, the less the noise. Thus, by isolating the grounded circuit with the PGS voltage technique, much of the system noise has been eliminated and it may now be possible to immediately locate the grounded component, even on soft grounds, by oscillating the ground current. All that is needed is a signal and a way to detect the signal. This may be addressed by one or more of the following manners:

A 1-megohm resistor may be added in the PGS relay in series with the 5 k resistor, as illustrated in FIG. 13. This increases the voltage across the 28 k resistor and increases the ground current.

Figure 14:
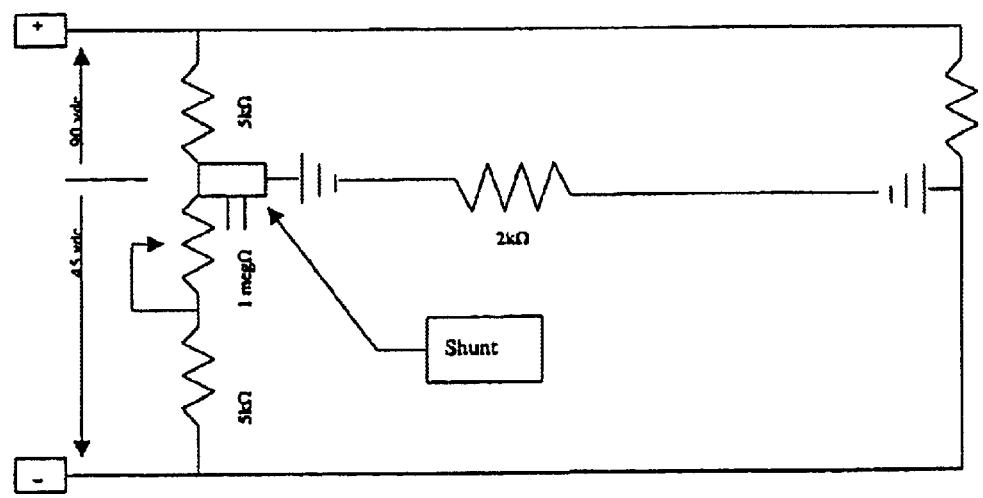
FIG. 14 illustrates a method for obtaining more ground current in a 30-volt ground where the ground resistance is 2 k ohms.

FIG. 14 demonstrates how more ground current is obtained in a 30 volt ground (currently barely find-able with conventional test equipment) where the ground resistance is 2 k ohms. By adding the 1-megohm resistor, the voltage changes from 30 vdc to 45 vdc across the ground resistance, this causes the ground current to increase from 15 ma to 22.5 ma. Since the smallest amount of current required to pick up a device on the dc system is 50.0 ma, the 1-megohm resister may be an automatic adjustment feature in order to have the maximum ground current limited to 30 ma by a shunt in the automatic circuit.

Figure 15A:
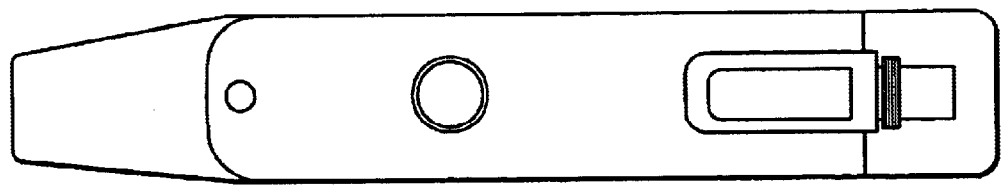
FIGS. 15A–15B illustrate a tick tracer.
Figure 15B:
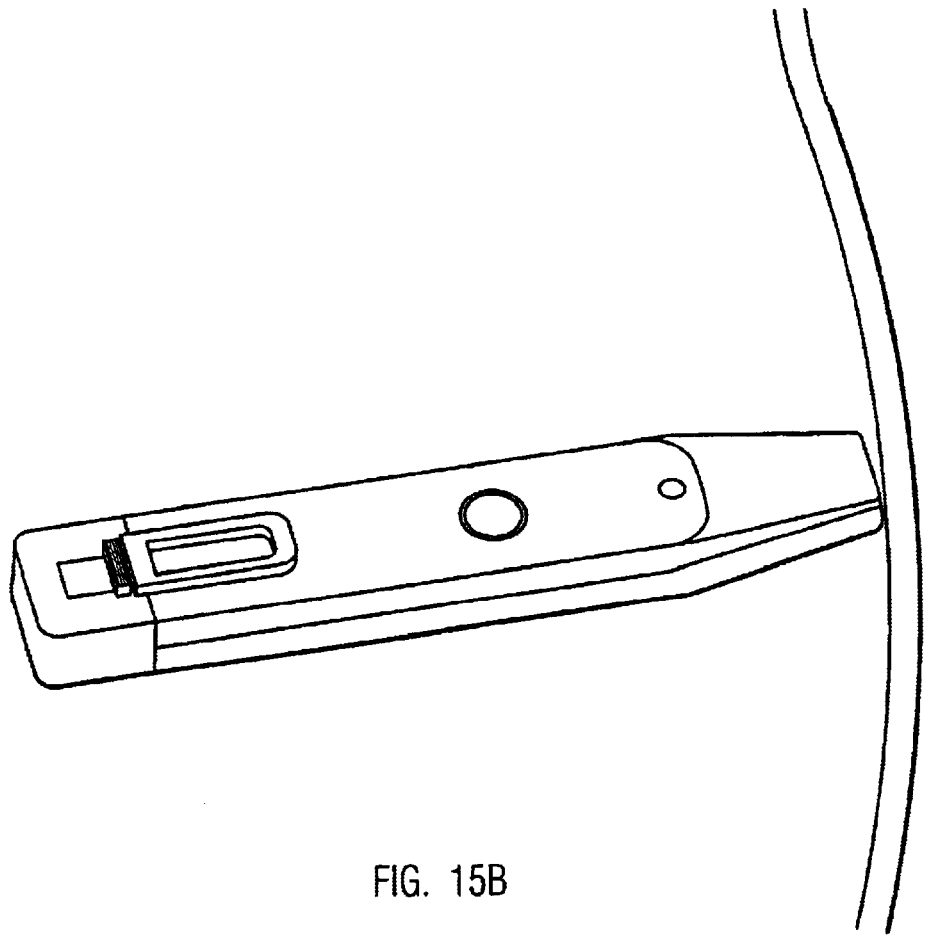

Also, if the ground current is oscillated at a specific frequency, a super sensitive tick tracer may be able to be used to locate the grounded component. A representative tracer is depicted in FIGS. 15A and 15B, which will light at 60 volts, 60 hertz ac and about 6 ma and may be used for locating the signal implied on the grounded circuit if made more sensitive and distinguished out noise.

Figure 16:
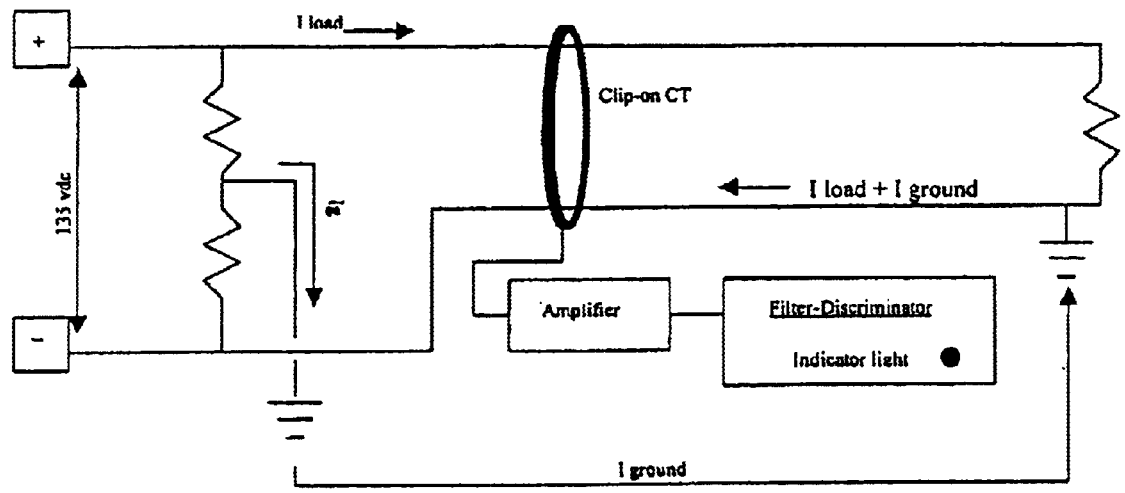
FIG. 16 illustrates a representative method that includes a clip-on current transformer.
Figure 17:
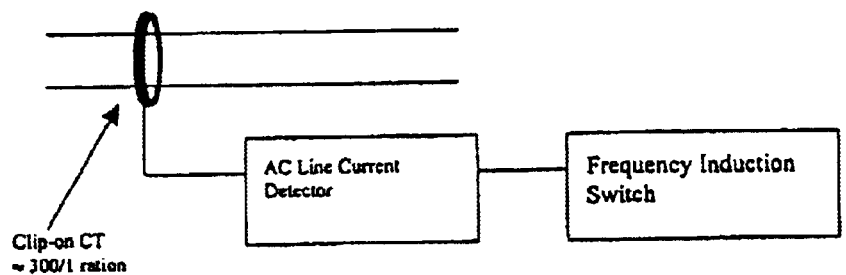
FIG. 17 illustrates a representative method for utilizing a clip-on CT.

Another method includes a clip-on current transformer as depicted in FIG. 16. A current transformer is an attenuator and is designed with a specific input to output ratio. For example, a 1000/1 CT will output 1 amp for every 1000 amps on the cable it is clamped (clipped) around. If the ground current is oscillated, the CT may be able to pick it up (though it has been attenuated). Then, amplify the output signal, run the amplified signal through a band pass filter/discriminator and out to an indicating light. FIG. 17 illustrates a representative method for utilizing a clip-on CT.

Figure 18A:
FIGS. 18A–18D illustrate representative waveforms.
Figure 18B:
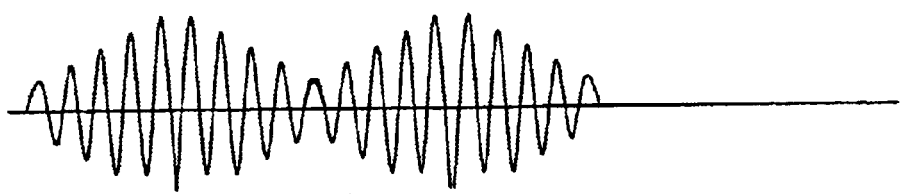
Figure 18C:
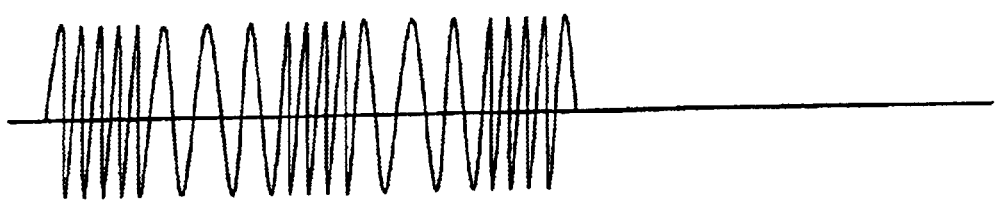
Figure 18D:

Theoretically, noise is to be cancelled out by clipping around both positive and negative leads. If noise is still a problem, a user may approach it the same way as the SETI project. The search group looks for radio waves of a distinct logical progression and discriminates random progressions assumed to be noise. Embodiments of the present invention embrace the incorporation of similar methodology. For example, a user may oscillate the ground current at specific intervals as depicted in the waveform illustrated in FIG. 18A. Alternatively, a user may use amplitude modulation as seen in FIG. 18B. As illustrated in FIG. 18C, noise is greatly filtered out with frequency modulation (FM) and band pass filters as compared to the AM signal in FIG. 18B. With reference to FIG. 18D, high voltage spikes may be used, but may cause a soft ground to flash over to a hard ground. Those skilled in the art will appreciate that pulse modulation and/or sawtooth waveforms may also be used to locate grounds.

In accordance with embodiments of the present invention, the signal frequency is to be kept as low as possible and still remain detectable, and may not be a multiple of 60 hertz. The reason high frequencies are not preferred is because long cable lengths are very capacitive in nature to AC signals, as is indicated by the following formula for capacitive reactance:

$$X_C = \frac{1}{2(pi)(\text{frequency})(\text{capacitance between line and ground})}$$

Accordingly, embodiments of the present invention embrace keeping the capacitive reactance as high as possible or more resistant to AC current flow than the actual ground path. The lower the capacitance, the higher the capacitive reactance or the less an AC signal is capacitively coupled to ground.

Another variable is frequency, which may be controlled. The lower the frequency the higher the capacitive reactance. Since the lead length may not be changed, the capacitive reactance may be somewhat compensated for by using the lowest frequency possible. Also, as previously discussed, using a tick tracer may also be useful at lower frequencies for a similar reason. A tick tracer is a capacitive voltage sensor that relies on a series capacitor connection between the technician's body as a low capacitance (high capacitive reactance, large voltage drop) path coupled with a high capacitance (low capacitive reactance, small voltage drop) path between the technician's shoes and ground.

The oscillation of the ground current option may be useful in locating grounds for two reasons:

1. The closer the PGS system is connected to the grounded component, the less noise will be on the circuit. Therefore, there may be a point at which the PGS system would not have to be further paralleled onto the circuit to locate the grounded component.

2. If the PGS system goes through all circuits and no ground is found, the current method could be used to find hard grounds on higher amperage circuits.

Figure 19:
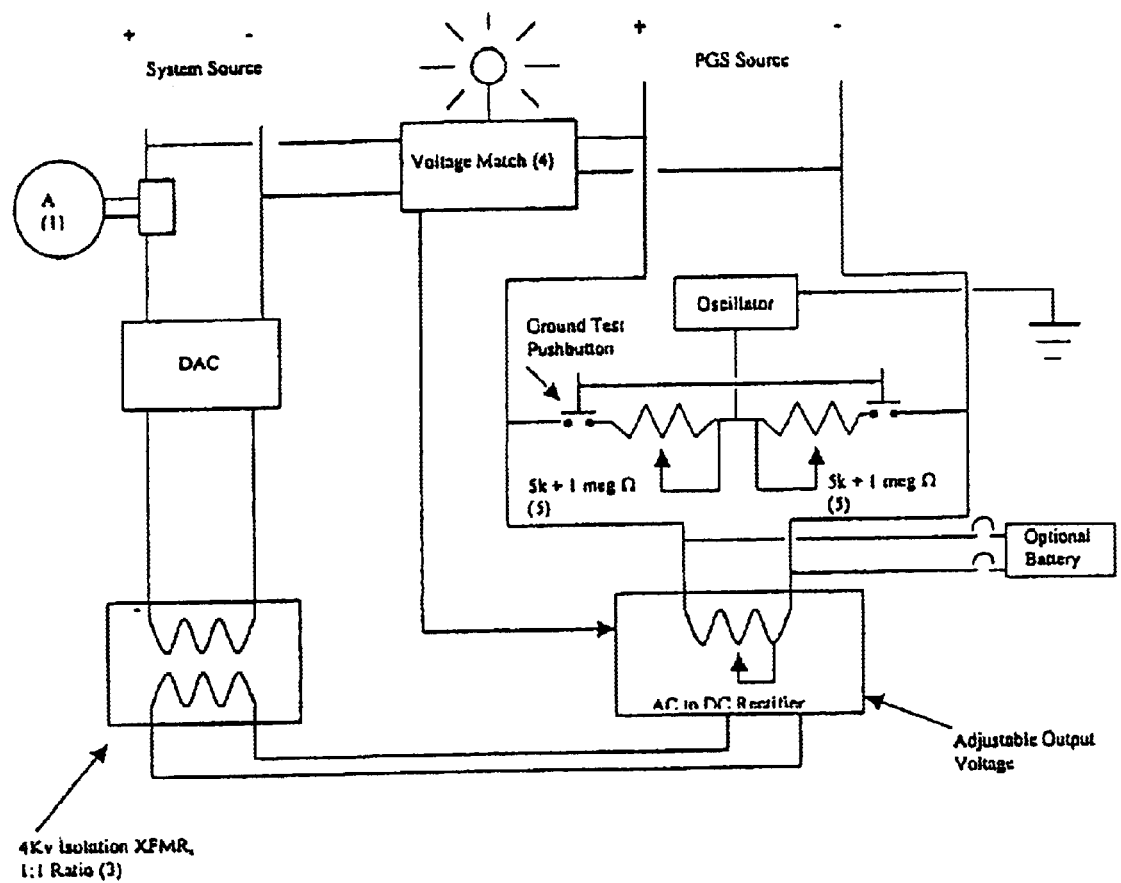
FIG. 19 illustrates representative PGS system equipment.

In one embodiment, a representative PGS system equipment conceptual view is illustrated in FIG. 19.

In one embodiment, the DC PGS system is comprised of a unique power source, a high power DC-to-DC converter. An ammeter switch may also be installed where the technician/user may check the amps on the system, prior to switching the load to the PGS system. To read amps, a user may set the ammeter switch to "system amps," plug circuit, and open knife switch. To turn the PGS on, a user may close the knife switch, turn the amp switch to "PGS," and then reopen the knife switch.

If the two systems were tied together, the isolation between the system and PGS system grounds would be defeated. Accordingly, in one embodiment, an indication is provided to the user as to which way to adjust the PGS system voltage to match the system voltage. The light may then illuminate when the voltages are matched. A further embodiment includes the installation of two voltmeters.

Current carrying components that go into the PGS system are rated for 30 amps or more. This way the breaker that feeds the circuit is also the protection for the circuit when it is powered by the PGS system. The shunt and ammeter built into the PGS system shows the circuit current so the operator knows how close the circuit is to overload. This is also useful data when analyzing the grounded circuit.

In one embodiment, a battery is connected, which contemplates series of batteries or a redundant PGS system to the output of the rectifier to provide power to the circuit. Should the first PGS system open circuit, the battery or second PGS provides power to the circuit under test until the test switch is re-closed, which would re-establish the normal feed to the circuit. And, having a backup power supply in the event of a PGS failure gives the user a sense of confidence that the troubleshooting may be performed with minimal risk. In a further embodiment, output jacks are provided on the PGS system to connect the battery or second PGS system.

The battery may have to be disconnected when utilizing the "current" troubleshooting method. The battery has a low internal resistance and may appear as a short across the positive and negative to the current signal. This battery system would be of a low amphour rating such as 2.0 amphours or 30 amps for 15 minutes.

In one embodiment, several PGS systems are paralleled to provide even higher currents.

In another embodiment, the PGS system includes a fail light and an optional audible alarm in case the system fails and the battery takes over. The battery system includes diodes so that it cannot feed the fault in the PGS system. This option gives the technician time to re-close the test switch feed the circuit from its normal source. The actual amount of time the technician has to re-close the test switch depends on the rating of the battery, the condition of the battery, and the amount of load on the circuit.

In one embodiment, the equipment is used to calculate and display the ground resistance value since the ground current and the voltage across it are known.

Figure 20A:
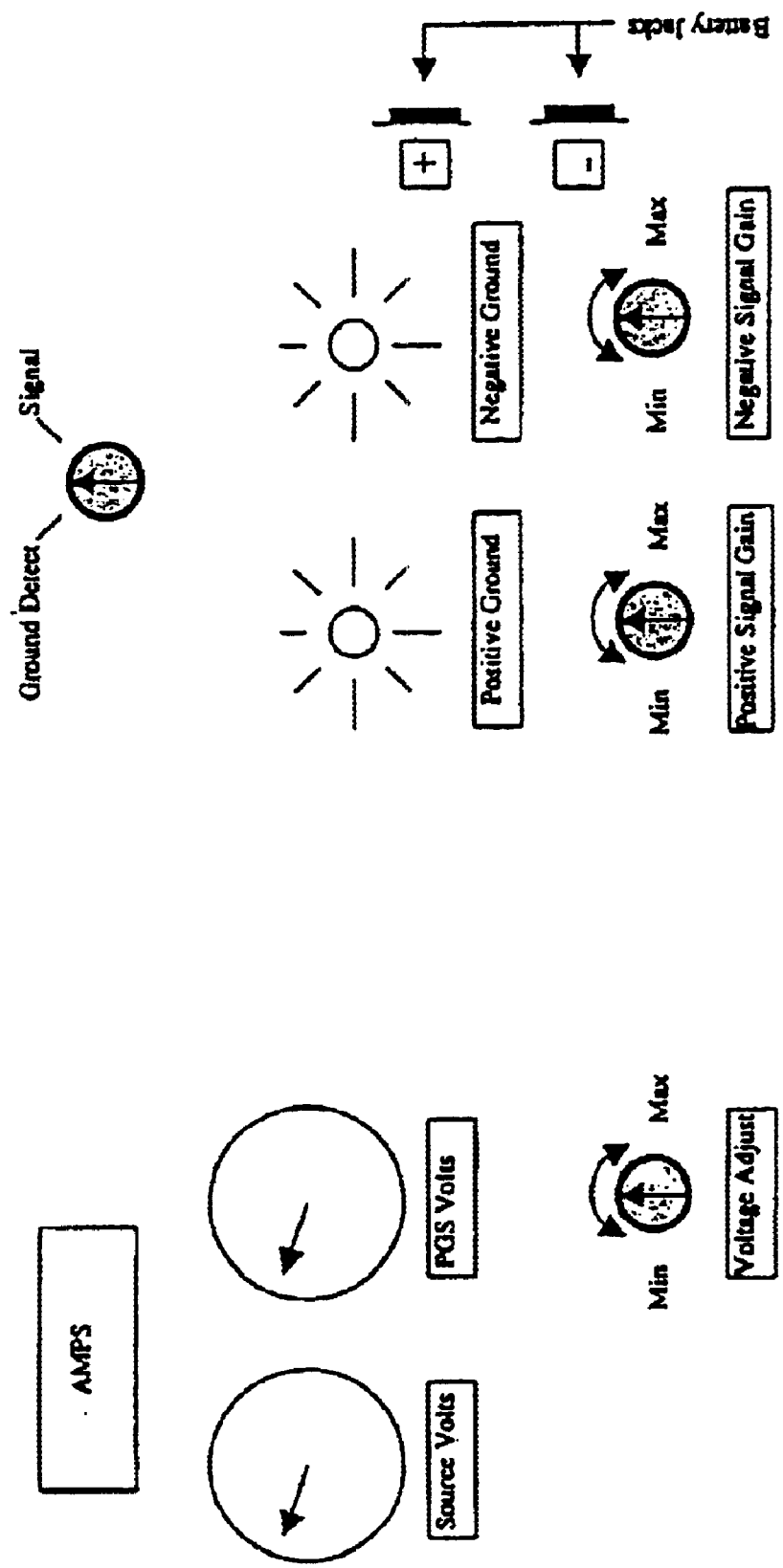
FIGS. 20A–20C illustrate representative systems in accordance with the present invention.
Figure 20B:
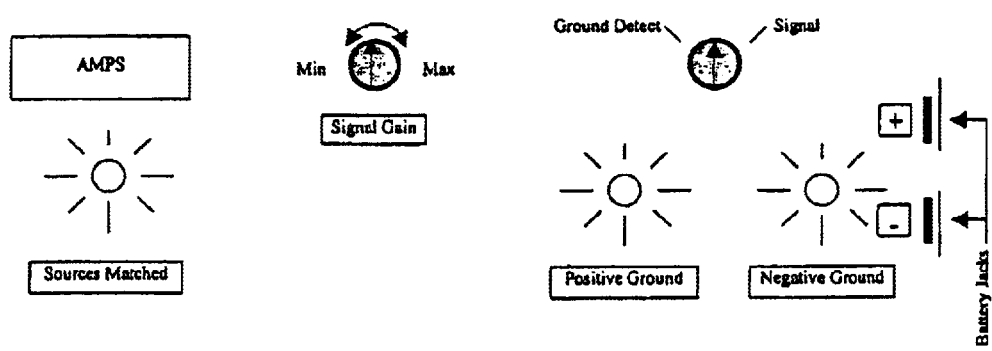
Figure 20C:
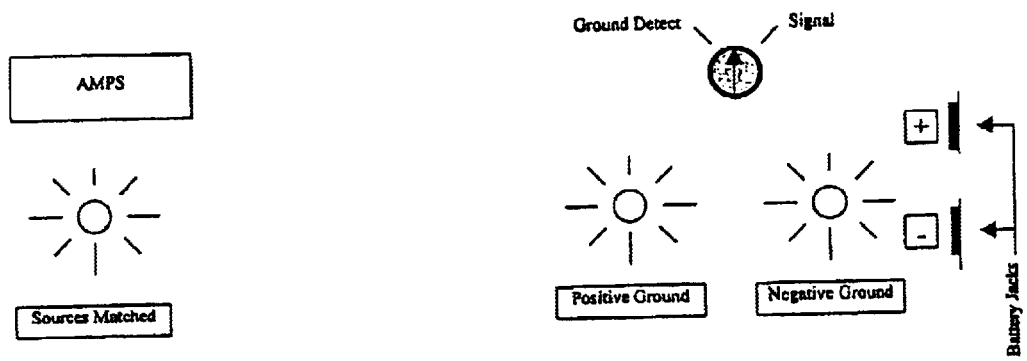

FIGS. 20A–20C provide representative PGS system test sets. In FIG. 20A, the illustrated PGS system test set includes two voltmeters and two gain resistors. In FIG. 20B, the illustrated PGS system test set includes automatic voltage matching, and one signal gain (1 megohm) pot. In FIG. 20C, the illustrated PGS system set includes automatic voltage matching and will automatically insert 1 megohm of resistance in the correct leg of the circuit when the signal button is pressed.

In one embodiment, the PGS system is about the size of a standard 5 kv megger (excluding batteries) and is easily portable. In another embodiment, the PGS system is similar to a modern suitcase-like enclosure with wheels and a "pop-up" handle. Also, the DC PGS is also a unique power source by itself offering a high power DC-to-DC converter.

The PGS system is the only test equipment available that may be relied upon to isolate soft and hard grounds on ungrounded systems with minimal risk. Accordingly, it is highly desirable to the utility, mining, manufacturing, and various other industries worldwide that are plagued by grounds on their systems and equipment.

Thus, as discussed herein, the embodiments of the present invention embrace systems and methods for locating a ground fault. More particularly, the present invention relates to systems and methods for locating any faults to ground on an ungrounded AC or DC system without de-energizing the circuit, and enabling isolation of the grounded component of the circuit. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

Figure 21:
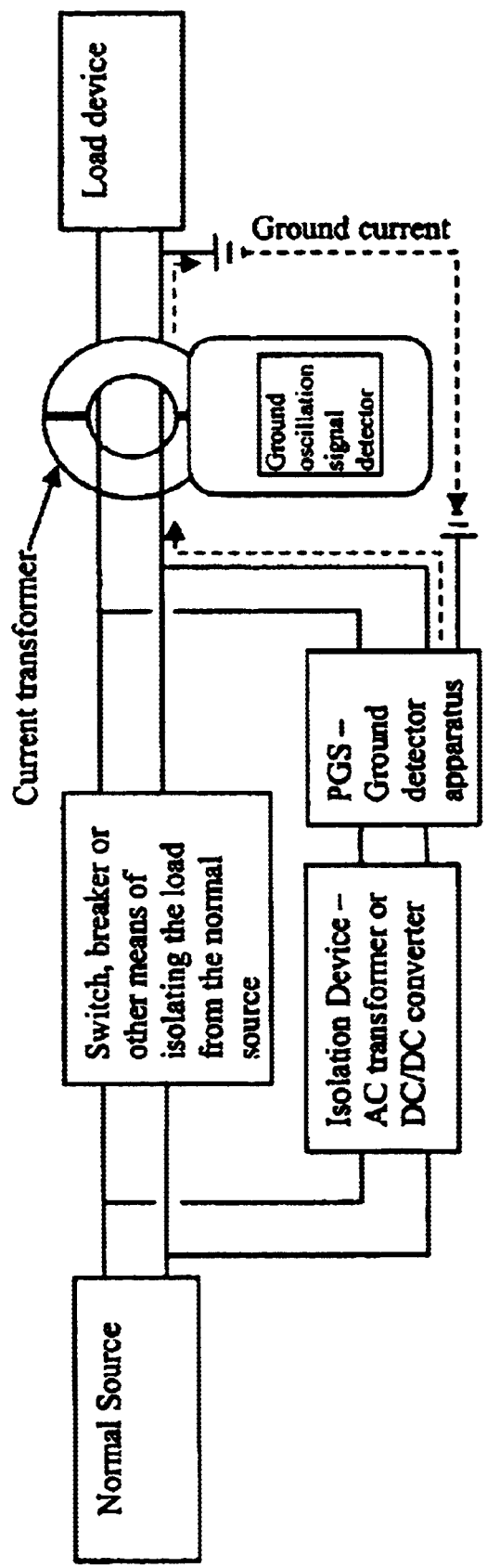
FIG. 21 illustrates a representative embodiment, wherein the isolation device is a transformer for AC or a converter for DC.

In the embodiment illustrated in FIG. 21, the isolation device is a transformer for AC or DC/DC converter for DC. Both have a ground detector apparatus on their output. This apparatus only functions if there is a fault to ground on the circuit somewhere. The isolation device is paralled with the normal power source to the load. The normal source is then removed, leaving the isolation as the new source feeding the load. If the load or the circuit feeding it has a ground, the ground detector apparatus will operate. When it operates it will let the technician know which "leg" of the circuit has a fault to ground. The ground detector apparatus will then oscillate the ground current and the technician will clip a current transformer around the grounded circuit at various locations. The current transformer will feed a signal detector that will detect the ground current oscillations using this method. The technician should be able to narrow down the location of the grounded point of the circuit.

What is claimed is:

1. A method for locating a grounded circuit on an ungrounded system without de-energizing the circuit, the method comprising the steps for:
   feeding a load through an isolation device of a system circuit to isolate the load from a distribution system without de-energizing the load;
   paralleling the isolation device with a source for the load, wherein the source is isolated to leave the load energized and fed by the isolating device;
   adding a ground detector relay at a secondary side of the isolation device;
   oscillating the system circuit; and
   detecting a ground on the system circuit.

2. A method as recited in claim 1, wherein the system circuit is an AC system circuit.

3. A method as recited in claim 2, wherein the isolation device is one of:
   (i) a transformer, and
   (ii) a distribution switch gear.

4. A method as recited in claim 3, further comprising the step for isolating any ground that comes in on a secondary side of the isolation device.

5. A method as recited in claim 2, wherein the AC system is rated at one of:
   (i) 30 amps; and
   (ii) less than 30 amps.

6. A method as recited in claim 2, wherein the AC load is located in a small distribution switchgear that is fed from a large switchgear.

7. A method as recited in claim 2, further comprising the step for performing troubleshooting on the AC system circuit without de-energizing the AC load.

8. A method as recited in claim 1, wherein the system circuit is a DC system circuit.

9. A method as recited in claim 8, wherein the isolation device is a DC-to-DC converter.

10. A method as recited in claim 9, further comprising the step for isolating any ground that comes in on a secondary side of the isolation device.

11. A method as recited in claim 8, wherein the DC system is rated at one of:
    (i) 30 amps; and
    (ii) less than 30 amps.

12. A method as recited in claim 8, wherein the DC load is located in a small distribution switchgear that is fed from a large switchgear.

13. A method as recited in claim 8, further comprising the step for performing troubleshooting on the DC system circuit without de-energizing the DC load.

14. A ground fault location system comprising:
    an energized circuit;
    an isolation device selectively coupled to the energized circuit; and
    a ground detector relay coupled to the output of the energized circuit, wherein the ground fault location system is an automatic ground seeking system and is configured to be coupled at a small distribution system where the isolation device and the ground detector relay are paralleled on branch circuits.

15. A ground fault location system as recited in claim 14, wherein the ground fault location system is a stand-alone ground seeking system.

16. A ground fault location system as recited in claim 15, wherein the stand-alone ground seeking system is configured to be permanently coupled near a source of a ground.

17. A ground fault location system as recited in claim 14, wherein the ground fault location system is a portable ground seeking system.

18. A ground fault location system as recited in claim 14, wherein the isolation device comprises one of (i) a DC/DC converter and (ii) an AC/DC converter for a DC ungrounded circuit.

19. A ground fault location system as recited in claim 14, wherein the isolation device comprises one of (i) a DC/AC converter and (ii) an AC/AC transformer for an AC ungrounded circuit.

* * * * *